US011874333B2

United States Patent
Hascoat et al.

(10) Patent No.: US 11,874,333 B2
(45) Date of Patent: Jan. 16, 2024

(54) STATE OF HEALTH OF A BATTERY (71) Applicant: ELECTRICITE DE FRANCE, Paris (FR)

(72) Inventors: Aurélien Hascoat, Fontainebleau (FR); Laurent Torcheux, Yerres (FR); Luc Gombert, Boissy le Chatel (FR); Alain Hita, Fontainebleau (FR)

(73) Assignee: ELECTRICITE DE FRANCE, Paris (FR)

( * ) Notice: Subject to any disclaimer, the term of this patent is extended or adjusted under 35 U.S.C. 154(b) by 185 days.

(21) Appl. No.: 17/414,718

(22) PCT Filed: Dec. 9, 2019

(86) PCT No.: PCT/EP2019/084262
§ 371 (c)(1),
(2) Date: Jun. 16, 2021

(87) PCT Pub. No.: WO2020/126623
PCT Pub. Date: Jun. 25, 2020

(65) Prior Publication Data
US 2022/0065942 A1 Mar. 3, 2022

(30) Foreign Application Priority Data
Dec. 17, 2018 (FR) ...................................... 1873046

(51) Int. Cl.
*G01R 31/392* (2019.01)
*H01M 10/42* (2006.01)
(Continued)

(52) U.S. Cl.
CPC ......... *G01R 31/392* (2019.01); *G01R 31/367* (2019.01); *H01M 10/4285* (2013.01); *H01M 10/44* (2013.01); *H02J 7/0068* (2013.01)

(58) Field of Classification Search
CPC .............. G01R 31/392; G01R 31/367; H01M 10/4285; H01M 10/44; H02J 7/0068
(Continued)

(56) References Cited

U.S. PATENT DOCUMENTS

| 2004/0220758 | A1* | 11/2004 | Barsoukov .......... H01M 50/569 702/63 |
| 2016/0322675 | A1 | 11/2016 | Gomez Perez et al. |
| 2018/0328995 | A1* | 11/2018 | Kondo .................. H01M 10/48 |

FOREIGN PATENT DOCUMENTS

| EP | 2746797 A1 | 6/2014 |
| EP | 2944970 A1 | 11/2015 |

(Continued)

OTHER PUBLICATIONS

International Search Report (with English translation) and Written Opinion (with Machine translation) dated May 27, 2020 in corresponding International Application No. PCT/EP2019/084262; 23 pages.

*Primary Examiner* — Lee E Rodak
*Assistant Examiner* — Trung Q Nguyen
(74) *Attorney, Agent, or Firm* — Maier & Maier, PLLC (57) ABSTRACT

A method of constructing a chart of correlations between a rapid discharge and a slow discharge in order to measure the wear of at least one electrochemical cell, including a measurement phase that includes a training sequence followed by a characterization sequence, and an aging phase. Each of the sequences includes charging-relaxing-discharging-relaxing under controlled conditions and is repeated with different conditions. The time of each discharge is measured. The aging phase includes an alternation of charges and discharges with no intermediate relaxation and is implemented before each repetition of the measurement phase, such that a real capacity is obtained for a plurality of pairs of imposed parameters.

8 Claims, 4 Drawing Sheets

(51) Int. Cl.
*H02J 7/00* (2006.01)
*G01R 31/367* (2019.01)
*H01M 10/44* (2006.01)

(58) Field of Classification Search
USPC ............ 324/415, 437, 425–435, 76.11, 126,
324/756.05, 538, 200, 207.13, 233, 256,
324/515, 500–530
See application file for complete search history.

(56) References Cited

FOREIGN PATENT DOCUMENTS

| | | | |
|---|---|---|---|
| EP | 3258282 | A1 | 12/2017 |
| FR | 3020142 | A1 | 10/2015 |
| JP | S58-140969 | A | 8/1983 |
| WO | 2015/086753 | A1 | 6/2015 |

\* cited by examiner

STATE OF HEALTH OF A BATTERY

FIELD

The invention relates to the field of batteries, and more particularly to the diagnosis of electrochemical cells, or accumulators, which have already been used.

BACKGROUND

It is known to model the performance losses over time of electrochemical cells according to their use. This implies knowing the various usage parameters. In practice, their usage parameters, or history, are often unknown. There is therefore a need to qualify and quantify the degradation in performance of an electrochemical cell, or of a set of cells such as a battery, for which the conditions of previous use are unknown or uncertain. One of the performance parameters of an electrochemical cell is a variable called the "state of health", or SOH. This parameter, without units and generally expressed as a percentage, is defined as the ratio of the real electrical capacity Crea of the cell to the nominal electrical capacity $C_{nom}$ of the same cell. The following equation represents this parameter:

$$SOH = \frac{C_{rea}}{C_{nom}} \times 100 \qquad \text{[Math. 1]}$$

It is possible to measure the state of health of an electrochemical cell by fully discharging the cell in order to measure its capacity at a sufficiently weak current that parasitic effects can be considered negligible. Such parasitic effects are variable during aging of the cell but generally correspond to phenomena which convert the stored capacity into non-electrical energy and lead to a real capacity that is lower than the nominal capacity. Typically, such a measurement involves discharging the batteries for three hours under a weak current, as provided for by certain standards such as ISO standard 12405-4:2018.

Carrying out this type of diagnosis is less time-consuming and costly than dismantling the batteries, but remains long and therefore expensive. It is theoretically possible to perform other types of tests, in particular ones that are faster and under strong current. However, the results thus obtained would not be comparable to those obtained according to the standards in force. In practice, obtaining an indicator that is not comparable to the other indicators is of very limited or no interest. Creating an indicator outside the standard goes against the very purpose of a standard, which is to have a common system of reference. Creating a new indicator is therefore not desirable in principle.

The invention improves the situation.

SUMMARY

A method is provided for constructing a chart of correlations between a rapid discharge and a slow discharge in order to measure the wear of at least one electrochemical cell. The method comprises a measurement phase and an aging phase, the measurement phase itself including a training sequence followed by a characterization sequence. During the training sequence the following operations are implemented:

a. charging the at least one cell at a reference current level until a predetermined end-of-charge voltage is reached;

b. relaxing the at least one cell for a first duration;

c. discharging the at least one cell at the reference current level until a predetermined end-of-discharge voltage is reached;

d. relaxing the at least one cell for a second duration.

During the characterization sequence, the following operations are implemented:

i. charging the at least one cell at the reference current level until a predetermined end-of-charge voltage is reached;

ii. relaxing the at least one cell for a third duration;

iii. discharging the at least one cell at a selected current level until a predetermined end-of-discharge voltage is reached;

iv. relaxing the at least one cell for a fourth duration.

The characterization sequence is reiterated at least once, each time increasing the value of said selected current level relative to the previous iteration.

The time of each discharge is measured so that the real capacity of the cell can be deduced at each discharge as a function of the intensity of each discharge and of the measured discharge time.

The aging phase comprises an alternation of charges and discharges with no intermediate relaxation, and at the reference current level.

The measurement phase is reiterated at least once with a reference current level that is different from that of the previous iteration, the aging phase being implemented before each reiteration of the measurement phase, such that a real capacity is obtained for a plurality of pairs of parameters, each pair of parameters including a selected current level and a reference current level.

According to another aspect, a method is provided for determining a state of wear of an electrochemical cell, comprising the following operations:

a. discharging said electrochemical cell at a strong current level;

b. measuring the time and the electric current required to reach a predetermined electric voltage;

c. comparing the results of the measurement to a chart of correlations between a rapid discharge and a slow discharge of an electrochemical cell;

d. deducing from the comparison a level of wear of said at least one electrochemical cell under a weak current.

According to another aspect, a test bench is provided, arranged so as to be able to connect thereto the electrical terminals of an electrochemical cell or of a set of electrochemical cells. The bench comprises a control module capable of imposing a selected current and voltage between said terminals and a measurement module capable of measuring the current and voltage between said terminals. The control module and the measurement module are arranged to implement together at least one of the methods described herein.

According to another aspect, a computer program is provided comprising instructions for implementing all or part of a method as defined herein when this program is executed by a processor. According to another aspect of the invention, a non-transitory, computer-readable storage medium is provided on which such a program is stored.

The features disclosed in the following paragraphs may optionally be implemented. They may be implemented independently of each other or in combination with one another:

At least one of the reference current levels may be equal to one-third of the electric current enabling total discharge of the electrochemical cell in one hour.

From a first characterization sequence to the last, the value of the selected current level may vary from a weak current less than or equal to one-fifth of the electric current enabling total discharge of the electrochemical cell in one hour, to a strong current greater than or equal to five times the electric current enabling total discharge of the electrochemical cell in one hour.

The relaxation durations can be less than or equal to 120 minutes.

The real capacity of the cell can be deduced at each discharge by multiplying the intensity of each discharge by the measured discharge time or by applying the following equation:

$$C_v = \int_t i(t) \times dt \qquad \text{[Math. 2]}$$

The strong current level can be greater than one-third of the electric current enabling total discharge of the electrochemical cell in one hour, and the weak current level can be less than or equal to one-third of the electric current enabling total discharge of the electrochemical cell in one hour.

BRIEF DESCRIPTION OF THE DRAWINGS

Other features, details, and advantages of the invention will become apparent from reading the detailed description below, and from analyzing the accompanying drawings, in which.

DETAILED DESCRIPTION

The drawings and description below for the most part contain elements that are certain in nature. Therefore not only can they serve to provide a better understanding of the invention, but where appropriate can also contribute to its definition.

In the following, and in order to avoid unnecessarily complicating the text, reference is made to "a cell" on which the methods are implemented. The reader will understand, however, that "cell" is understood to mean either an isolated electrochemical cell or a set of several electrochemical cells assembled together and forming what is commonly called a battery.

In the following, reference is made to "current level". In this case, this is understood as defining a value for the cell charge or discharge current.

In the examples described here, the tests were carried out on cells of lithium-ion technology used in a context of an electric automobile. These cells typically have a voltage of between 2.5V and 3.4V and have an average discharge level of around 3V. The numerical examples correspond to such a context. The invention is not limited to the field of electric cars or even to the field of cells of lithium-Ion technology and can be transposed to other fields such as NiMH technologies, adapting the orders of magnitude of the example values where appropriate.

Figure 1:
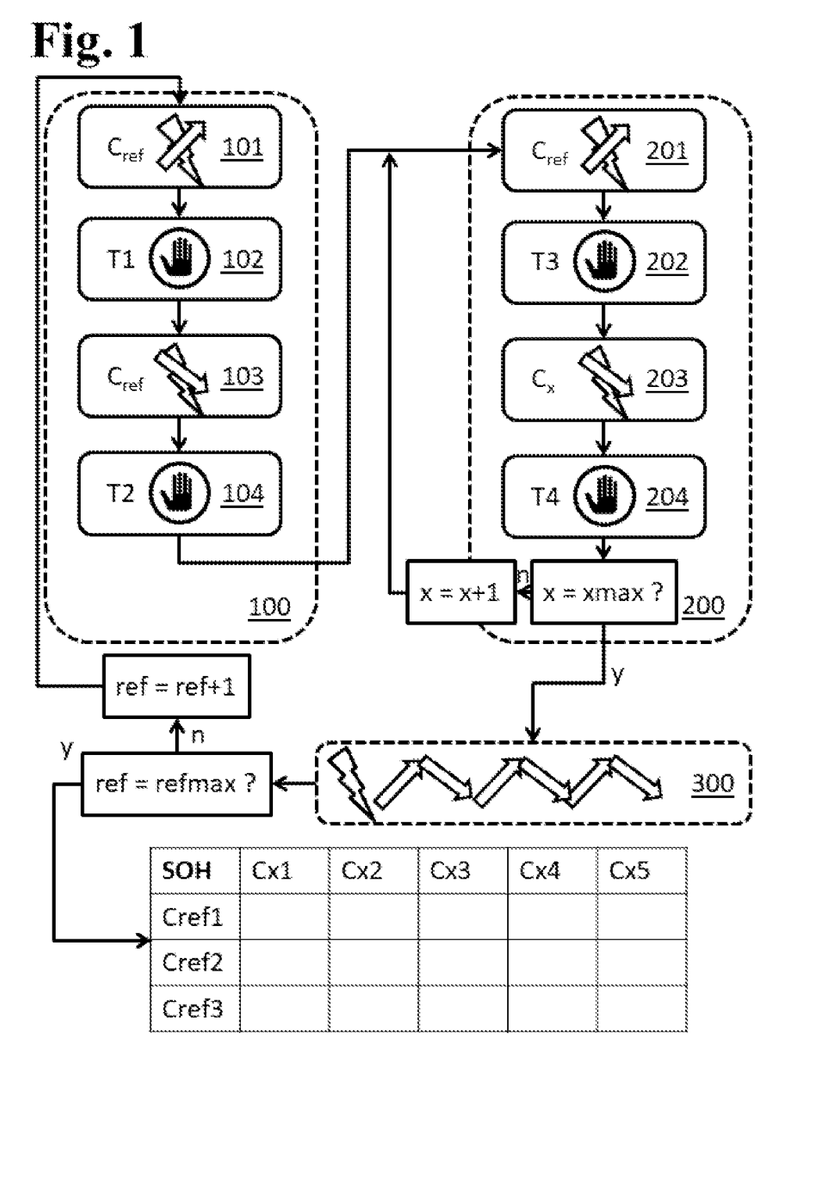
FIG. 1 shows a flowchart of a method according to one embodiment of the invention.
Figure 3:
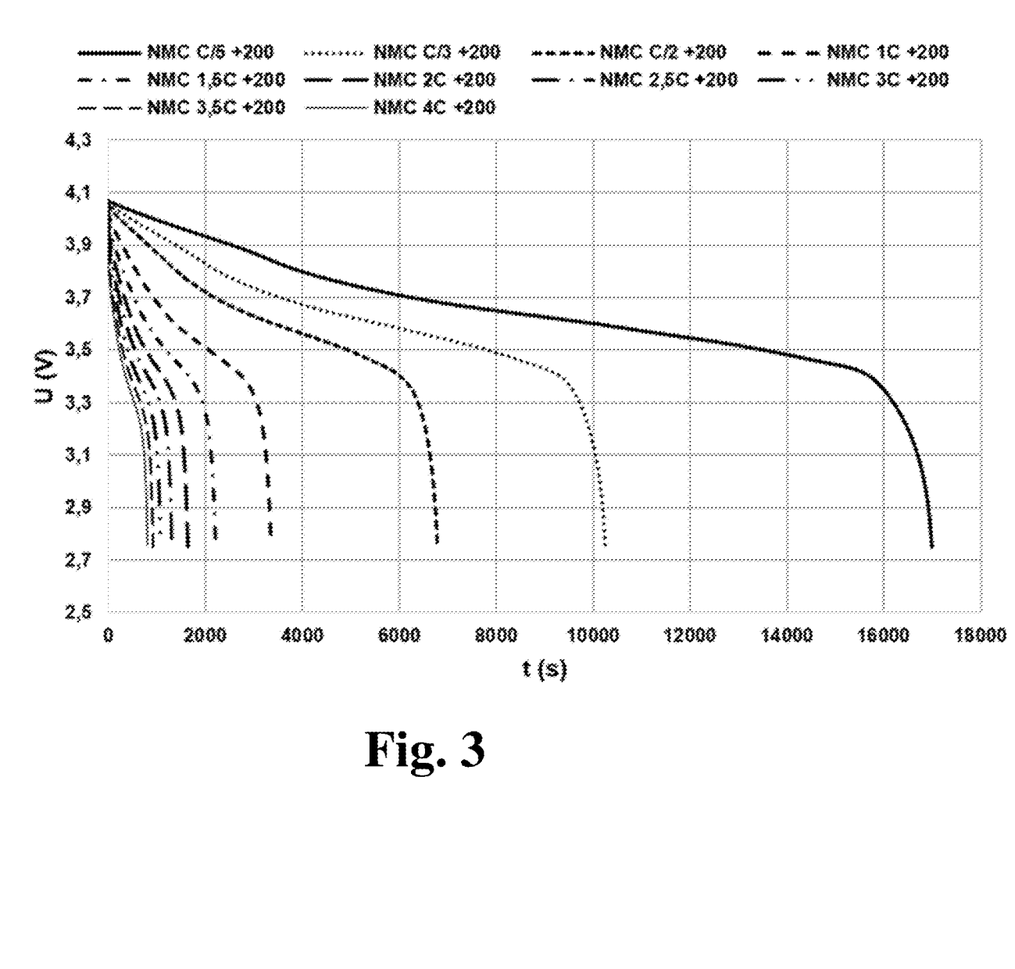
FIG. 3 shows an example of the change in voltage over time of an electrochemical cell, at various current levels.

Reference is now made to FIG. 1, in which an embodiment of a method of constructing a chart is shown, and to FIG. 3 representing part of the evolution of the voltage at the terminals of the cell during the implementation of the method. The chart then makes it possible to ensure a correspondence between a rapid discharge and a slow discharge in order to measure the wear of an electrochemical cell. By means of such a chart, it becomes possible to determine the behavior of the cell in the theoretical case where it is subjected to slow discharges even though, in practice, only rapid discharges are implemented.

The method comprises a measurement phase and an aging phase 300, the measurement phase itself including a training sequence 100 followed by a characterization sequence 200.

The training sequence 100 can be broken down into the following operations:

a. charging 101 the at least one cell at a reference current level $C_{ref}$;
b. relaxing the at least one cell for a first duration T1;
c. discharging 103 the at least one cell at the reference current level $C_{ref}$;
d. relaxing 104 the at least one cell for a second duration T2.

The reference current, or reference current regime, is a selected current value (in Amperes) to which the cell is subjected during the corresponding operations. In the examples described here, the reference current is expressed as a multiple of the electric current C enabling total discharge of the electric cell in one hour. The current C is the nominal current regime corresponding to a one-hour discharge from capacity. For example, a reference current denoted "C/5" is equivalent to one-fifth of the nominal current C.

As is apparent in FIG. 1, the training sequence 100 including operations 101, 102, 103, 104 can be reiterated during the method. During a sequence, the reference current level $C_{ref}$ remains constant. On the other hand, this value changes from one iteration of the training sequence 100 to another. In particular, when the measurement phase is reiterated at least once, it is reiterated with a reference current level $C_{ref}$ that is different from the one in the previous iteration. For example, the reference current level $C_{ref}$ is increased from one iteration to the next.

In the examples described here, at least one of the reference current levels $C_{ref}$ is equal to one-third C/3 of the electric current C enabling total discharge of the electric cell in one hour. The reference current level C/3 corresponds to the current level imposed in at least some of the test standards for electrochemical cells. Thus, having a chart for which the reference current level C/3 is one of the available reference current levels facilitates the conversion of the results into values comparable to those obtained according to the standard, including values obtained by tests different from those of the methods described here.

In the examples described here, the relaxation durations T1 and T2 are each less than or equal to 120 minutes and preferably less than or equal to 60 minutes. In the example shown in FIG. 2, the first relaxation duration T1 is equal to 60 minutes while the second relaxation duration T2 is equal to 30 minutes.

Figure 2:
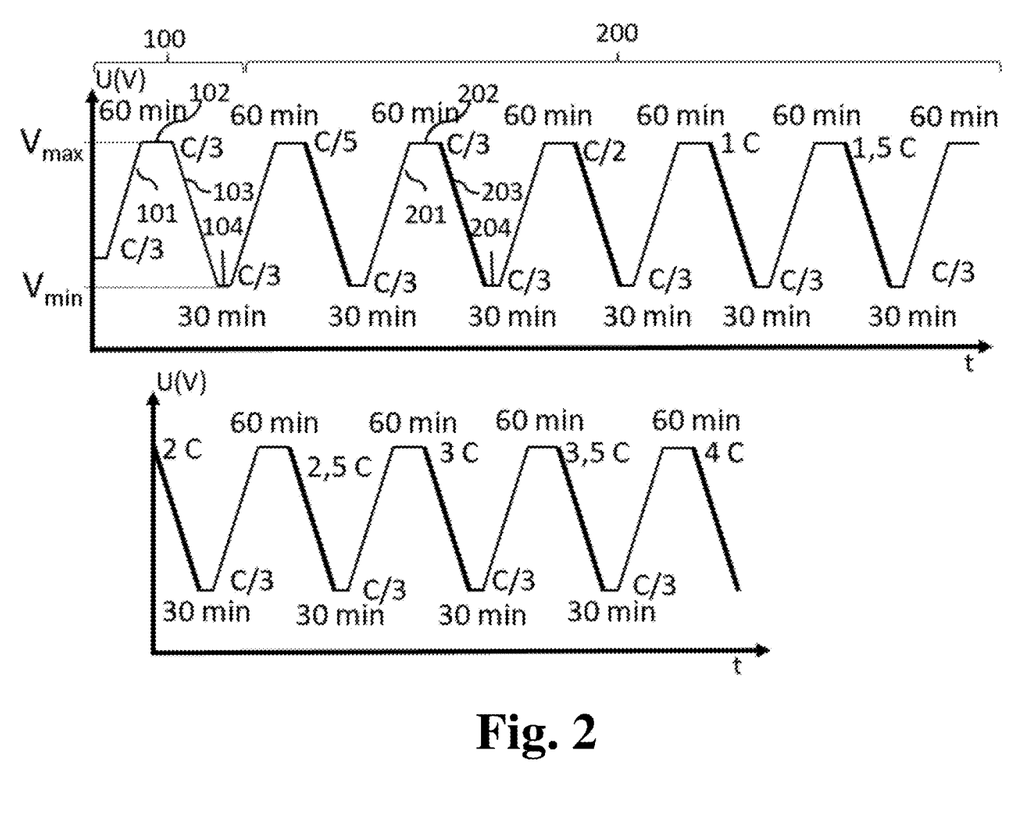
FIG. 2 shows an example evolution of a voltage during the implementation of an embodiment of the invention.

In the examples described here, the charging 101 and discharging 103 operations are implemented until a respective end-of-charge voltage $V_{max}$ and end-of-discharge voltage $V_{min}$ are reached. In other words, the aim here respectively is a "complete charge" or a "complete discharge". The charging/discharging is considered to be finished when the voltage at the terminals of the cell reaches a nominal value (in Volts) corresponding to the nominal charge/discharge level of the cell.

The characterization sequence 200 can be broken down into the following operations:

i. charging 201 the at least one cell at the reference current level $C_{ref}$;
ii. relaxing 202 the at least one cell for a third duration T3;
iii. discharging 203 the at least one cell at a selected current level $C_x$;
iv. relaxing 204 the at least one cell for a fourth duration T4.

The reference current level $C_{ref}$ is identical to that of the training sequence 100 which immediately precedes the characterization sequence 200.

In the examples described here, the relaxation durations T3 and T4 are each less than or equal to 120 minutes and preferably less than or equal to 60 minutes. In the example shown in FIG. 2, the third relaxation duration T3 is equal to 60 minutes while the fourth relaxation duration T4 is equal to 30 minutes.

The selected current $C_x$ is a selected current intensity value (in Amperes) to which the cell is subjected during the corresponding operations (203). In the examples described here, the selected current $C_x$ is, here again, expressed as a multiple of the electric current C enabling total discharge of the electric cell in one hour. As can be seen in FIG. 1, the characterization sequence 200 including operations 201, 202, 203, 204 can be reiterated during the method. The selected current level $C_x$ varies from one iteration of the characterization sequence 200 to another.

In the examples described here, from a first characterization sequence to the last, the value of the selected current level $C_x$ increases from a weak current to a strong current. For example, the selected current level $C_x$ varies from a weak current less than or equal to one-fifth C/5 of the electric current C enabling total discharge of the electric cell in one hour, up to a strong current greater than or equal to five times the nominal electric current C enabling total discharge of the electric cell in one hour. In the example shown in FIG. 2, the value of the selected current level $C_x$ successively takes the following values: C/5; C/3; C/2; C; 1.5C; 2C; 2.5C; 3C; 3.5C; 4C; 5C. Alternatively, higher current levels can be implemented.

In the examples described here, the charging 201 and discharging 203 operations are carried out until a respective end-of-charge voltage V' max and end-of-discharge voltage V'min are reached. In other words, the aim here is respectively a "complete charge" or a "complete discharge". The charging/discharging is considered to be finished when the voltage at the terminals of the cell reaches a nominal value (in Volts) corresponding to the nominal charge/discharge level of the cell. The time required to reach this voltage naturally decreases as the current increases. The loss of restored capacity when the discharge current increases is visible in FIG. 4. Laboratory tests following the same protocol are performed on the same cells at different stages of aging in order to monitor the effect of the current over time.

When the number of iterations of the characterization sequence 200 has reached a maximum, the aging phase 300 is implemented. The iterations of the characterization sequence 200 make it possible to take into account experimentally the effect of strong current on the measured capacity, by gradually increasing the current regime at each iteration. This also makes it possible to consider the discharge energy while ignoring the heating (weak current regime) and to identify a strong current value (for example up to 5C) for which:

the electrochemical phenomena are essentially accelerated (by analysis of the discharge slopes);
the deterioration caused by rapid discharge is negligible with respect to the study.

In other words, the characterization sequence 200 makes it possible to take into account the parasitic effects due to the use of a strong current compared to the use of a weak current.

The aging phase comprises an alternation of charges and discharges. The alternations of charges and discharges do not include any intermediate relaxation. The aging phase is carried out at the reference current $C_{ref}$. The value of the reference current level $C_{ref}$ is identical to that of the preceding characterization sequence 200. The number of charge-discharge cycles may, for example, be between 1 and 5000, for example around 200 cycles. The purpose of the aging phase is, as its name suggests, to artificially reduce the performance of the cell by accelerating its wear compared to "normal" use, meaning to reduce its lifespan, its SOH. To achieve this effect, the number of cycles can be adapted according to the type of cells. The aging phase 300 is implemented before each reiteration of the measurement phase 100-200. Measurements are thus obtained at different stages of aging of the cell.

The aging phases 300 make it possible to experimentally measure the effects of the decrease in SOH, and therefore to obtain equivalent measurements for different levels of wear of a cell. Thus, the combination of the measurement phase 100-200 and the aging phase 300 makes it possible to take into account, experimentally, all of the parasitic mechanisms that vary during the life of a cell.

During each characterization sequence 200, in particular during operation 203, the time of each discharge as well as the electric current during the discharge are measured. Thus, the real capacity $C_v$ (or restored capacity) of the cell can be deduced at each discharge, for example by multiplying the intensity of each discharge by the measured discharge time. A real capacity $C_v$ is obtained for a plurality of pairs of parameters, each pair of parameters including a selected current level $C_x$ and a reference current level $C_{ref}$. In cases where the evolution of the current over time is complex (e.g. non-constant), the capacity can be calculated by an integral over time rather than by a simple multiplication. Above, we proposed using the value of the restored real capacity as comparison values. However, other values derived from the measurements can be obtained and used as comparison values. For example, the restored energy can form such a comparison quantity.

From the above equation [Math. 1], we can directly deduce the following equation for any two regimes, for example under a reference current $C_{ref}$ and a selected current $C_x$:

$$C_{nom} = \frac{C_{v,ref}}{SOH_{ref}} = \frac{C_{v,x}}{SOH_x} \qquad [\text{Math. 3}]$$

We can therefore deduce:

$$SOH_{ref} = SOH_x \left(\frac{C_{v,ref}}{C_{v,x}}\right) \qquad [\text{Math. 4}]$$

The ratio $C_{v,ref}/C_{v,x}$ can be called the "corrective factor". For example, if we choose a weak current as the reference current value $C_{ref}=C/3$ and a strong current as the selected current value $C_x=4C$, we obtain the following equation:

$$SOH_{C/3} = SOH_{4C}\left(\frac{C_{v,C/3}}{C_{v,4C}}\right) \quad \text{[Math. 5]}$$

It is therefore understood that by measuring a state of health (SOH) of a cell under a strong current (here 4C) and therefore by a rapid test, it is possible, by applying the corrective factor whose value is given by the results of prior reference tests, to obtain a state of health value equivalent to that which would have been obtained by particularly long tests under weak current (here C/3). In the example implemented by the applicant, the discharge under strong current is accomplished in about 15 minutes. It is therefore easily understood that the durations under a strong current are particularly short compared to equivalent tests carried out under weak currents on the same cells.

At the end of the method described above, we therefore have a set of corrective factors for various pairs of regimes. The set of factors then forms a chart of correlations, or a converter, between discharges under at least two different regimes, in particular a rapid discharge and a slow discharge, in order to measure the wear of at least one electrochemical cell. The chart may take the form of a two-dimensional table such as the one shown below. Of course, the reader understands that the chart, or conversion data set, can be presented in other forms, for example in the form of curves such as those shown in FIG. 3 and FIG. 4.

TABLE 1

| $C_{v,ref}/C_{v,x}$ | $C_{x1}$ | $C_{x2}$ | $C_{x3}$ | $C_{x4}$ |
|---|---|---|---|---|
| $C_{ref1}$ | | | | |
| $C_{ref2}$ | | | | |
| $C_{ref3}$ | | | | |

Figure 4:
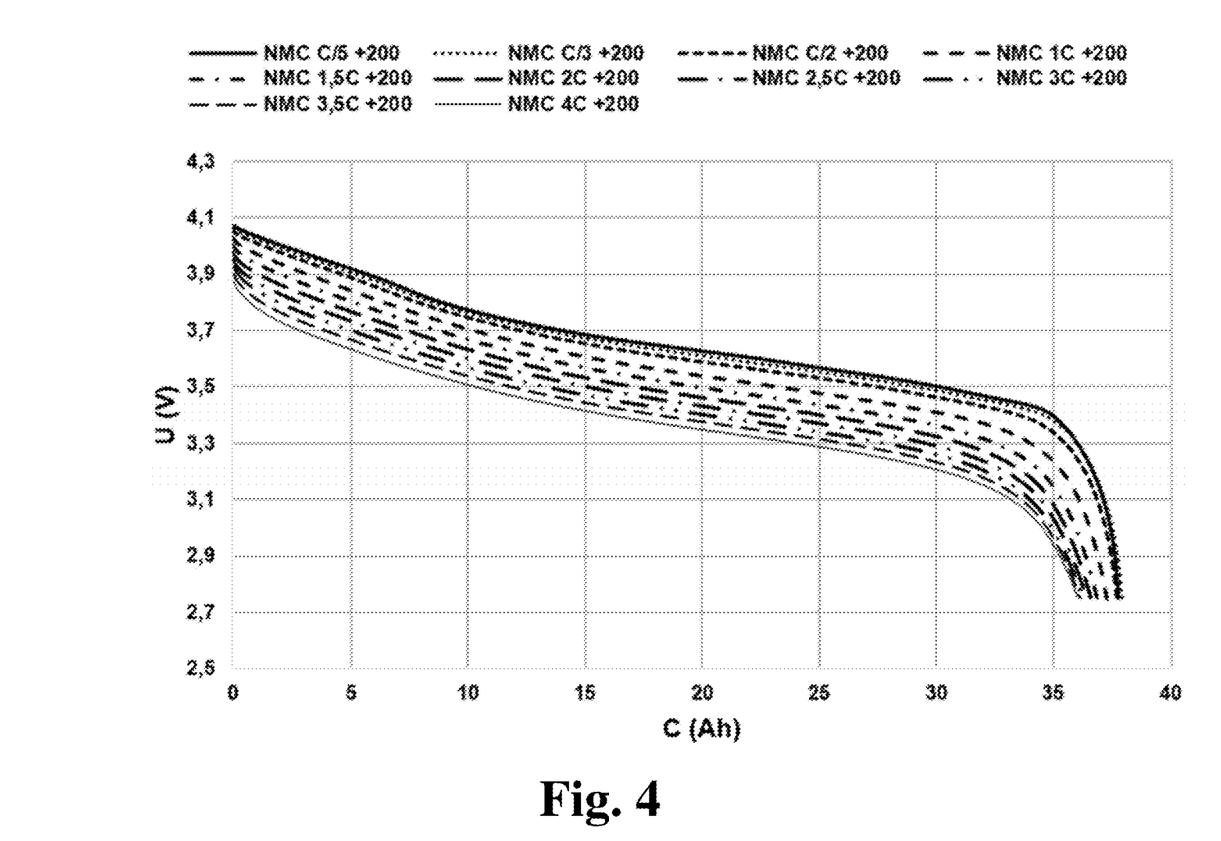
FIG. 4 shows an example of a voltage-capacity relationship of an electrochemical cell, at various current levels.

In FIG. 3 are shown the evolutions in voltage (in Volts) during discharges (time in seconds) for different discharge regimes. In FIG. 4 are shown the evolutions in voltage (in Volts) as a function of the electrically restored capacity (in Ampere-Hours) for different discharge regimes. The experimental results shown in FIG. 3 and FIG. 4 were obtained for a cell of Lithium-Ion technology of the NMC type (NMC for "Nickel Manganese Cobalt"). For this exemplary cell, FIG. 3 and FIG. 4 each form a representation of the chart obtained.

The processes described above for obtaining a conversion chart can in themselves be viewed as a first method, the chart being the result of the first. Using the chart to determine the state of wear of a battery can be viewed as a second method. The second method is then a method of determining a state of wear of an electrochemical cell.

The method of determining a state of wear of an electrochemical cell comprises the following operations:
 a. discharging the electrochemical cell at a strong current level, for example 4C;
 b. measuring the time to reach a predetermined electric voltage V"min, for example a predetermined terminal voltage considered negligible, and the electric current;
 c. comparing the results of the measurement (directly or after conversion into other quantities, for example in the form of the measured time for the discharge, the energy restored, and/or the capacity restored) to a chart of correlations between a rapid discharge and slow discharge of an electrochemical cell, for example a chart obtained according to the first method;
 d. deducing from the comparison a level of wear of said at least one electrochemical cell under a weak current, for example C/3.

The method of determining a state of wear of an electrochemical cell may be implemented by means of a test device such as a measurement bench. Such a measurement bench is arranged so as to be able to connect the electrical terminals of an electrochemical cell or of a set of electrochemical cells to it. The bench comprises a control module capable of imposing a selected current and voltage between said terminals and a measurement module capable of measuring the current and voltage between said terminals. The control module and the measurement module are arranged to implement together the method of determining a state of wear of an electrochemical cell.

For the implementation, the bench may be controlled manually via a control interface of the control module or it may be controlled in an at least partly automated manner. In the case of automated control, the bench may comprise a non-transitory computer-readable storage medium on which is stored a program for implementing the method of determining a state of wear of an electrochemical cell. The medium is accessible by a computer, or at least by a computing device, capable of implementing the program.

The proposed innovations make it possible to significantly reduce the duration of the discharging to measure the residual capacity (for example from 3 hours to less than 30 minutes) for a cell. This is applicable to complex assemblies of cells forming modules or packs. Complex and costly dismantling operations become superfluous because it is sufficient to access the electrical terminals of the cell or assembly of cells. Reliable and rapid measurement of the state of health of a cell becomes possible.

The invention may find applications in particular in a context of checking used batteries, for example checking their condition before allocating them to a new use. Typically, electric vehicles such as automobiles operate with batteries of several hundred cells, assembled to provide the electric motor with sufficient power and to guarantee an acceptable autonomy. Battery performance naturally deteriorates over use (cycling aging) or even when not in use (calendar aging). For electric vehicles, the aging depends for example on the type of cells used, the use of the vehicle, the climate, the location of the garage, and even the color of the vehicle which affects the temperature of the vehicle. The gradual loss of performance results in a gradual loss of autonomy that is difficult to manage (difficult to predict). When the autonomy becomes unacceptable, a new battery replaces the previous one.

One way to recycle the old battery is to reuse it in an area where the reduced performance remains acceptable. For example, used vehicle batteries can be used for stationary storage of electrical energy available in a power grid, for example in combination with unpredictable intermittent photovoltaic production. In general, such reallocations of use are part of the European Union's target goal of constructing a circular economy. For this purpose, it becomes necessary to be able to check the performance of each battery before reassignment, and to do so by the fastest and least expensive process possible. The innovations proposed here contribute to this objective.

The invention is not limited to the examples of methods, test benches, computer programs, and storage media described above solely by way of example, but encompasses all variants conceivable to those skilled in the art in the context of the protection sought.

The invention claimed is:

1. A method for constructing a chart of correlations between a rapid discharge and a slow discharge in order to measure the wear of at least one electrochemical cell,
the method comprising a measurement phase and an aging phase, the measurement phase itself including a training sequence followed by a characterization sequence;
the following operations being implemented during the training sequence:
a. connecting terminals of the at least one cell to a test bench comprising a control module and a measurement module;
b. imposing by the control module a reference current level between said terminals and charging the at least one cell at the reference current level until a first predetermined end-of-charge voltage is measured, by the measurement module, between the terminals;
c. relaxing the at least one cell for a first duration;
d. discharging the at least one cell at the reference current level until a first predetermined end-of-discharge voltage is measured between said terminals by the measurement module;
e. relaxing the at least one cell for a second duration;
the following operations being implemented during the characterization sequence:
i. connecting the terminals of the at least one cell to the test bench comprising the control module and the measurement module;
ii. imposing by the control module the reference current level between said terminals and charging the at least one cell at the reference current level until a second predetermined end-of-charge voltage is measured by the measurement module between the terminals;
iii. relaxing the at least one cell for a third duration;
iv. discharging the at least one cell at a selected current level until a second predetermined end-of-discharge voltage is measured between said terminals by the measurement module;
v. relaxing the at least one cell for a fourth duration;
the characterization sequence being reiterated at least once, the control module each time increasing the value of said selected current level relative to the previous iteration;
the time of each discharge of the characterization sequence being measured by the measurement module so that the real capacity of the cell can be deduced at each discharge as a function of an intensity of an electric current during each discharge and of the measured discharge time;
the aging phase comprising an alternation of charges and discharges with no intermediate relaxation, and at the reference current level;
the measurement phase being reiterated at least once with a reference current level imposed by the control module that is different from that of the previous iteration, the aging phase being implemented before each reiteration of the measurement phase, such that a real capacity is obtained for a plurality of pairs of parameters, each pair of parameters including a selected current level among the selected current levels of successive iterations of the characterization sequence and a reference current level among the reference current levels of successive iterations of the characterization sequence,
the method further comprising constructing a chart of correlations between a rapid discharge and a slow discharge, said chart providing a corrective factor for the each pair of parameters, the corrective factor being a ratio of the real capacity at one of the reference current levels to the real capacity at one of the selected current levels.

2. The method according to claim 1, wherein at least one of the reference current levels of successive iterations of the characterization sequence is equal to one-third of an electric current enabling total discharge of the electrochemical cell in one hour.

3. The method according to claim 1, wherein the value of said selected current level varies from a first value equal to a weak current less than or equal to one-fifth of an electric current enabling total discharge of the electrochemical cell during a first iteration of the characterization sequence, to a second value equal to a strong current greater than or equal to five times the electric current enabling total discharge of the electrochemical cell during a last iteration of the characterization sequence.

4. The method according to claim 1, wherein the relaxation durations are less than or equal to 120 minutes.

5. The method according to claim 1, wherein the real capacity of the cell is deduced at each discharge by multiplying the intensity of the electric current during each discharge by the measured discharge time or by applying the following equation:

$$C_v = \int_t i(t) \times dt$$

6. A method of determining a state of wear of an electrochemical cell, comprising the following operations:
a. connecting terminals of the at least one cell to a test bench comprising a control module and a measurement module;
b. imposing by the control module a strong current level between said terminals and discharging said electrochemical cell at the strong current level, said strong current level being greater than one-third of an electric current enabling total discharge of said electrochemical cell in one hour;
c. measuring by the measurement module a time and an electric current between said terminals to reach a predetermined electric voltage;
d. comparing the results of the measurement to a chart of correlations between a rapid discharge and a slow discharge of an electrochemical cell, said chart being constructed according to the method of claim 1;
e. deducing from the comparison a level of wear of said at least one electrochemical cell under a weak current smaller than or equal to one-third of the electric current enabling total discharge of said electrochemical cell in one hour, said level of wear of said at least one electrochemical cell under a weak current being obtained by applying a corrective factor provided in said chart to a level of wear of said at least one electrochemical cell under said strong current deduced from said results of the measurement.

7. A test bench arranged so as to be able to connect thereto electrical terminals of an electrochemical cell or of a set of electrochemical cells, said bench comprising a control module capable of imposing a selected current and voltage between said terminals and a measurement module capable of measuring a current and a voltage between said terminals, the control module and the measurement module being arranged to implement together the method according to claim 1.

8. A non-transitory computer-readable storage medium on which is stored a program for implementing the method according to claim 1 when this program is executed by a processor.

* * * * *